(12) United States Patent
Myles et al.

(10) Patent No.: US 7,812,753 B1
(45) Date of Patent: Oct. 12, 2010

(54) TRI-LEVEL DYNAMIC ELEMENT MATCHER ALLOWING REDUCED REFERENCE LOADING AND DAC ELEMENT REDUCTION

(75) Inventors: Andrew Myles, Edinburgh (GB); Andrew Terry, Edinburgh (GB)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 28 days.

(21) Appl. No.: 12/384,187

(22) Filed: Apr. 1, 2009

(30) Foreign Application Priority Data

Mar. 30, 2009 (EP) ................... 09368009

(51) Int. Cl.
H03M 1/66 (2006.01)
(52) U.S. Cl. ...................... 341/144; 341/172
(58) Field of Classification Search ......... 341/143, 341/144, 150
See application file for complete search history.

(56) References Cited

U.S. PATENT DOCUMENTS

| | | | |
|---|---|---|---|
| 5,134,402 A * | 7/1992 | Miyoshi ............... | 341/144 |
| 5,274,375 A | 12/1993 | Thompson | |
| 6,573,850 B1 * | 6/2003 | Pennock ............... | 341/150 |
| 6,952,176 B2 | 10/2005 | Frith et al. | |
| 7,079,063 B1 | 7/2006 | Nguyen et al. | |
| 7,388,533 B2 * | 6/2008 | Kim et al. ............. | 341/150 |
| 7,511,650 B2 * | 3/2009 | Chang et al. ........... | 341/145 |
| 7,538,705 B2 * | 5/2009 | Deval et al. ............ | 341/143 |
| 2005/0156773 A1 | 7/2005 | Galton | |
| 2007/0069934 A1 | 3/2007 | Mills et al. | |
| 2008/0309536 A1 | 12/2008 | Le Guillou et al. | |
| 2009/0016544 A1 * | 1/2009 | Li et al. .............. | 381/94.1 |
| 2010/0103014 A1 * | 4/2010 | Quiquempoix et al. ..... | 341/143 |

OTHER PUBLICATIONS

"A 108 dB SNR, 1.1 mW Oversampling Audio DAC With A Three-level DEM Technique," by Nguyen et al., IEEE Journal of Solid-State Circuits, vol. 43, No. 12, Dec. 2008, pp. 2592-2600.
"A 108cB SNR 1.1mW Oversamplinc Audio DAC with a Three-Level DEM Technique," by Nguyen et al., 2008 IEEE Iinternational Solid-State Circuits Conference, ISSCC 2008 / Session 27 / Delta-Sigma Data Converters / 27.1, pp. 488-489 & 630.
"TP 11.5: A Digitally-Corrected 20b Delta-Sigma Modulator," by Thompson et al., 1994 IEEE International Solid-State Circuits Conference, ISSCC94 / Session 11 / Oversampled Data Conversion / Paper TP 11.5, pp. 194-195.
"Linearity Enhancement of Multibit Delta-Sigma A/D and D/A Converters Using Data Weighted Averaging," by Baird et al., IEEE Transactions on Circuits and Systems-II: Analog and Digital Signal Processing, vol. 42, No. 12, Dec. 1995, pp. 753-762.
"Techniques for Preventing Tonal Behavior of Data Weighted Averaging Algorithm in Sigma-Delta Modulators," by Morteza Vadipour, IEEE Transactions on Circuits and Systems-II: Analog and Digital Signal Processing, vol. 47, No. 11, Nov. 2000, pp. 1137-1144.

(Continued)

Primary Examiner—Peguy JeanPierre
(74) Attorney, Agent, or Firm—Saile Ackerman LLC; Stephen B. Ackerman

(57) ABSTRACT

Systems and methods using the same to achieve a tri-level multi-bit delta-sigma DAC having reduced power consumption and voltage droop have been achieved. A new rotation-based first order noise-shaping Dynamic Element Matcher (DEM) technique for use with 3-level unit elements have been disclosed. Reduced reference loading has been achieved when the tri-level DEM scheme is applied to switched capacitor implementations in particular. Furthermore a differential switched-capacitor DAC implementation, which enables use of the DEM technique is disclosed. The invention allows reduced circuit complexity required to implement a N-bit DAC when constructed using 3-level unit elements.

36 Claims, 14 Drawing Sheets

OTHER PUBLICATIONS

IEEE Press/John Wiley & Sons Inc., 1997, ISBN 0-7803-1045-4, "Understanding Delta Sigma Data Converters," by R. Schreier et al., Chapter 6, Sections 6.3 and 6.4, pp. 184-198, 218, & 278-281.

IEEE Pess, 2005, ISBN 0-471-46585-2, "Delta-Sigma Data Converters: Theory, Design and Simulation," by S. R. Norsworthy et al., Chapter 8, Section 3, pp. 247-264.

* cited by examiner

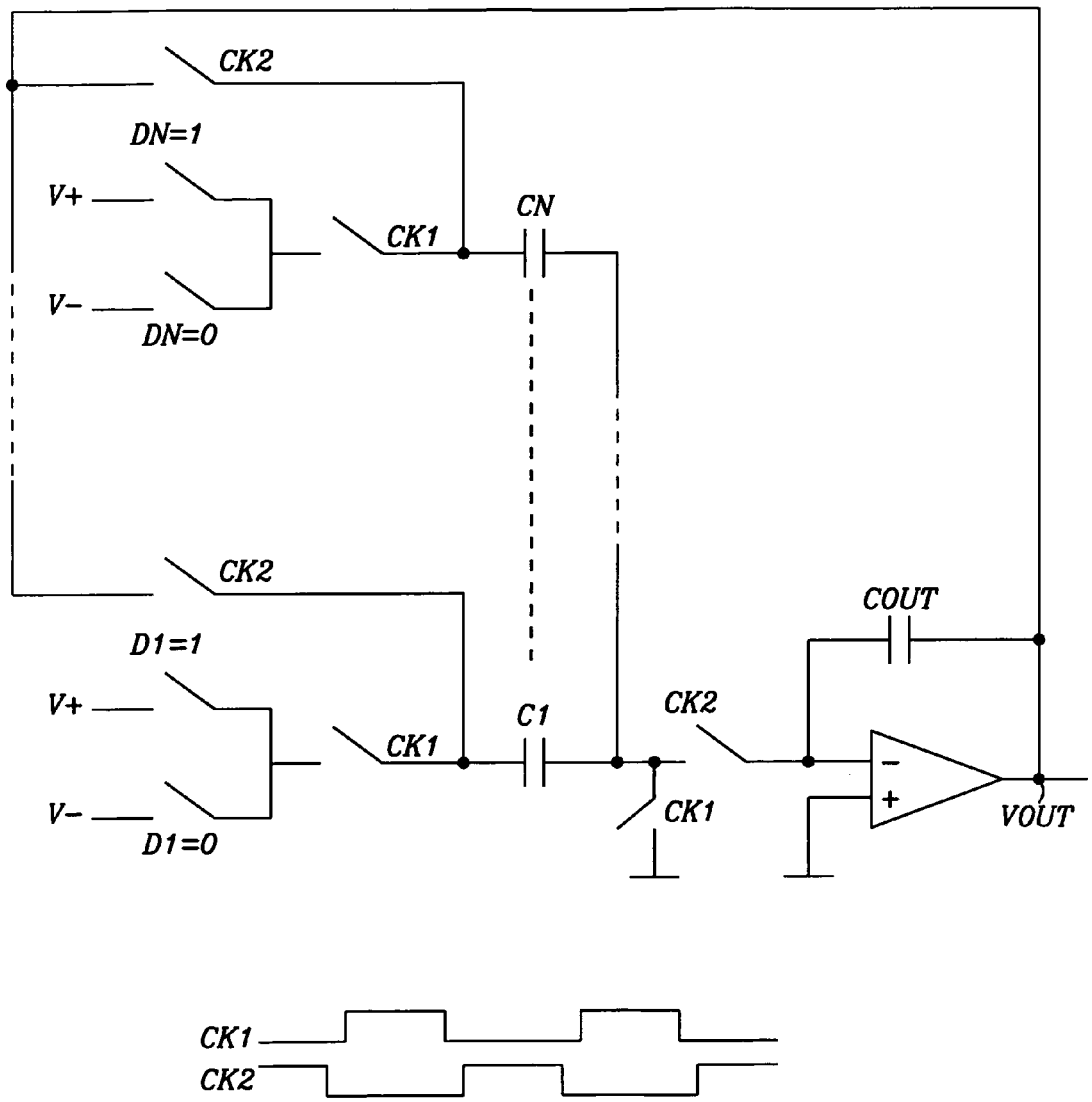
FIG. 1 — Prior Art

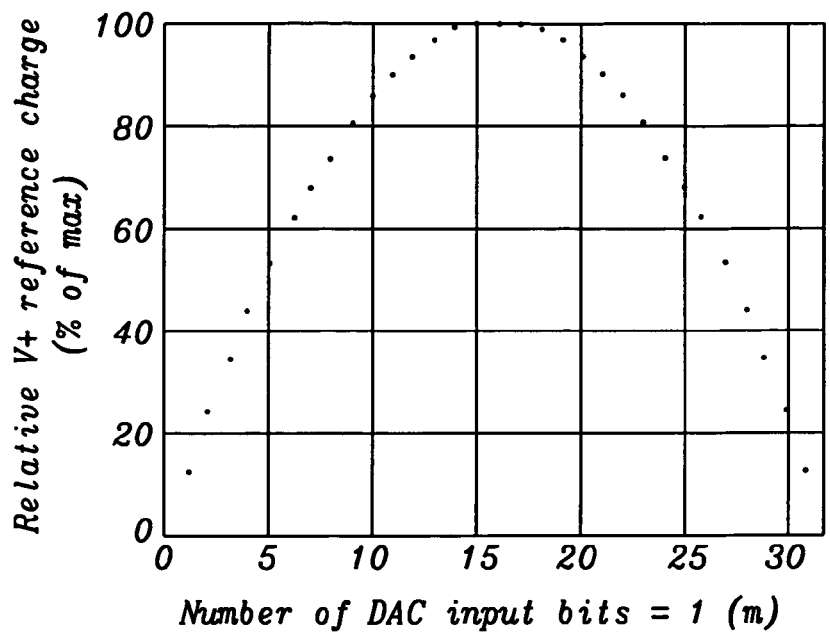
FIG. 2 - Prior Art
FIG. 3 - Prior Art

| DAC input code $m$ | $S=2m-n$ | DAC element utilization (N=8) |
|---|---|---|
| 3 | −2 | E1(−1) E2(−1) E3(0) E4(0) E5(0) E6(0) E7(0) E8(0) |
| | | NE Pointer → |
| 4 | 0 | E1(0) E2(0) E3(0) E4(0) E5(0) E6(0) E7(0) E8(0) |
| 5 | 2 | E1(0) E2(0) E3(−1) E4(−1) E5(0) E6(0) E7(0) E8(0) → |
| 0 | 0 | E1(−1) E2(−1) E3(−1) E4(−1) E5(−1) E6(−1) E7(−1) E8(−1) ⇒ |
| 8 | 8 | E1(+1) E2(+1) E3(+1) E4(+1) E5(+1) E6(+1) E7(+1) E8(+1) ⇒ |

FIG. 9

TRI-LEVEL DYNAMIC ELEMENT MATCHER ALLOWING REDUCED REFERENCE LOADING AND DAC ELEMENT REDUCTION

BACKGROUND OF THE INVENTION (1) Field of the Invention

This invention relates generally to digital-to-analog converters (DAC) and relates more specifically to three-level DACs applying dynamic element matching (DEM) techniques.

(2) Description of the Prior Art

A digital-to analog converter (DAC) is a device for converting a digital (usually binary) code to an analog signal (current, voltage or electric charge). The DAC fundamentally converts finite-precision numbers (usually fixed-point binary numbers) into a continuously varying physical quantity, usually an analogue electrical voltage.

In an ideal DAC, the numbers are output as a sequence of impulses, that are then filtered by a reconstruction filter. The DAC fundamentally converts finite-precision numbers (usually fixed-point binary numbers) into a continuously varying physical quantity, usually an analogue electrical voltage.

In an ideal DAC, the numbers are output as a sequence of impulses, that are then filtered by a reconstruction filter. This would, in principle, reproduce a sampled signal precisely up to the Nyquist frequency, although a perfect reconstruction filter cannot be practically constructed as it has infinite phase delay; and there are errors due to quantization.

Instead of impulses, usually the sequence of numbers update the analogue voltage at uniform sampling intervals.

These numbers are written to the DAC, typically with a clock signal that causes each number to be latched in sequence, at which time the DAC output voltage changes rapidly from the previous value to the value represented by the currently latched number. The effect of this is that the output voltage is held in time at the current value until the next input number is latched resulting in a piecewise constant or 'staircase' shaped output. This is equivalent to a zero-order hold operation and has an effect on the frequency response of the reconstructed signal.

The fact that practical DACs output a sequence of piecewise constant values or rectangular pulses would cause multiple signal images above the Nyquist frequency. The signal images result from the sampling process, i.e. they are already in the digital input of the DAC. These signal images are typically removed with a low pass filter acting as a reconstruction filter.

However, this filter means that there is an inherent effect of the zero-order hold on the effective frequency response of the DAC resulting in a mild roll-off of gain at the higher frequencies (often a 3.9224 dB loss at the Nyquist frequency) and depending on the filter, phase distortion. This high-frequency roll-off is the output characteristic of the DAC, and is not an inherent property of the sampled data.

Multi-bit delta-sigma DACs offer many advantages over single-bit delta-sigma DACs, such as much increased stable input range, less likelihood of unacceptable modulator tones and improved tolerance to clock jitter in the digital-to-analog conversion step. However, mismatches (such as random manufacturing variations) between the unit elements used to build a multi-bit DAC can cause non-linearity in the DAC transfer function, which causes signal distortion when converting a distortion-free digital signal to an analog signal. To achieve low distortion and a high signal-to-noise ratio (SNR), multi-bit DACs typically use dynamic element matching (DEM) techniques; these cause the element mismatches to generate an out-of-band noise-shaped noise instead of in-band distortion components. The resulting out-of-band noise energies can be removed by post-filtering if required. Various DEM methods are known for multi-bit DACs made of unit elements with two states (e.g. switched capacitor DACs using two reference voltages or switched current DACs using two reference currents). If 3-state unit elements can be used then it may be possible to reduce the number of DAC elements required (i.e. circuit complexity) to achieve a certain number of binary bits equivalent analog outputs levels.

A further known issue with most switched capacitor DACs implementations is signal-dependent loading of the DAC reference voltages, which can lead to signal distortion. One way to remove signal dependency is to always draw the maximum reference current, but this maximizes reference power, which is undesirable in low-power systems. Techniques which reduce the current from the reference can reduce distortion and power. It is a challenge for the designers of DACs to reduce therefore the peak reference current significantly compared to prior art.

There are known patents, patent publications or other publications dealing with the design of DACs:

U.S. Patent Publication (US 2005/0156773) to Galton proposes an improvement to a conventional multistage pipelined Analog-to-Digital Converter (ADC) having multiple stages, connected one to the next by an interstage amplifier, each stage with a flash digital-to-analog converter (DAC), a digital-to-analog converter (DAC) producing an associated intermediate analog signal, a subtractor of intermediate analog signals to produce an analog difference signal fed to the interstage amplifier of a next following stage, and a thermometer encoder producing an associated digital output signal; the improvement directed to canceling noise resultant from component mismatch, particularly mismatched capacitors paired with a first-stage DAC of the ADC. The improved ADC uses in at least a first, and preferably two, stages a flash DAC of a dynamic element matching (DEM) type producing, as well as an associated intermediate analog signal, random bits and parity bits; a Digital Noise Cancellation (DNC) logic circuit, receiving the random bits and the parity bits and a digitized residue sum of the digital output signal's arising from all stages beyond a stage of which the DNC logic circuit is a part, so as to produce an error estimate for the stage; and a subtractor subtracting the error estimates of the DNC logic circuits from the combined digital output signal of all higher stages in order to produce a corrected ADC digital output signal. A 14-bit 4-stage pipelined ADC having, by way of example, a theoretical optimum conversion precision of 14.1 bits and a realistic conversion precision of 10.4 bits, is enhanced by modestly-sized and continuously-automatically-operative DNC to realize 13.3 bits conversion precision.

U.S. Patent Publication (US 2008/0309536 to Le Guillou) discloses an analog-to-digital converter of the Sigma Delta type provides a stream of digital output samples (OUT) in response to an analog input signal. The analog-to-digital converter comprises a quantizer that has a dead zone. The quantizer provides a digital output sample that has a mid-point value when the quantizer receives an input signal whose amplitude is within the dead zone. A feedback path within the analog-to-digital converter provides a feedback action only in response to a digital output sample that has a value other than the mid-point value.

(U.S. Pat. No. 7,079,063 to Nguyen et al.) teaches a system for processing digital signals in a data converter. The system includes a thermometer encoder for receiving signed binary data and for providing signed thermometer data. The signed thermometer data includes positive thermometer data and negative thermometer data. The system also includes a shuffler that receives positive input data responsive to the positive thermometer data and receives negative input data responsive to the negative thermometer data. The system also includes a decoder for receiving output data from the shuffler and providing decoded data to an analog output stage. It is a tri-level DEM method by analog devices using a shuffler-based design.

Furthermore K. Nguyen has published: "A 101 dB SNR, 1.1 mW Oversampling Audio DAC with A Three-level DEM Technique", K. Nguyen, A. Bandyopadhyay, B. Adams, K. Sweetland, P. Baginski, *Journal of Solid-State Circuits*, December 2008, vol. 43 no. 12, pp 2592-2600 and ISSC 2008, pp 488-489 "A 108 db SNR 1.1 mW Oversampling Audio DAC with a three level DEM Technique" by K. Nguyen, A, Bandyopadhyay, R. Adams, K. Sweetland and P. Baginski) is based on the patent (U.S. Pat. No. 7,079,063 to Nguyen et al.) cited above explaining some advantages of a tri-level DAC implementation.

(U.S. Pat. No. 6,952,176 to Frith et al.) discloses generally digital-to-analogue converters and relates more particularly to techniques for reducing signal dependent loading of reference voltage sources used by these converters. A differential switched capacitor digital-to-analogue (DAC) circuit comprises first and second differential signal circuit portions for providing respective positive and negative signal outputs with respect to a reference level, and has first and second reference voltage inputs for receiving respective positive and negative references. Each of said first and second circuit portions comprises an amplifier with a feedback capacitor, a second capacitor, and a switch to switchably couple said second capacitor to a selected one of said reference voltage inputs to charge the second capacitor and to said feedback capacitor to share charge with the feedback capacitor. The switch of said first circuit portion is further configured to connect said second capacitor of said first circuit portion to share charge with said feedback capacitor of said second circuit portion; and the switch of said second circuit portion is further configured to connect said second capacitor of said second circuit portion to share charge with said feedback capacitor of said first circuit portion. This enables the second capacitors to in effect be alternately pre-charged to positive and negative signal-dependent nodes so that, on average, signal dependent loading of the references is approximately constant.

This patent teaches signal dependent loading in switched capacitor DAC implementations, it results in constant reference loading, hence causes no signal dependent loading, but it is not low reference power because it is constantly maximum loading.

(U.S. Pat. No. 6,573,850 to Pennock) describes a switched capacitor digital-to-analogue converter (DAC) 400 for reducing signal dependent loading of a reference voltage source used by the converter comprises an active circuit with a feedback element. The feedback element comprises a feedback capacitor, a second capacitor (106) and switches to connect the second capacitor to one of first and second reference sources to store charge on the second capacitor and to connect the second capacitor in parallel with the feedback capacitor to share said stored charge with the feedback capacitor. The switch is further configured to connect the second capacitor to a substantially signal-independent reference prior to connection of the second capacitor to said one of said first and second references. Connecting the second capacitor to a substantially signal-independent reference source prior to the selected first or second reference gives a linear signal-dependent loading of the first and second reference sources. Connecting two such circuits with anti-phase signals then causes these linear dependences to cancel, giving a substantially signal-independent loading of these reference sources.

This patent is a precursor patent to (U.S. Pat. No. 6,952,176 to Frith et al.) cited above and is also related to signal dependent loading in switched-capacitor DAC implementations. Adding a discharge phase in the clocking arrangement removes all traces of signal from the DAC capacitors before they are switched to the reference, This achieves signal independence but makes the clock generation more complicated and results in maximum reference loading for all digital input codes. (i.e. higher power dissipation).

(U.S. Pat. No. 5,274,375 to Thompson) describes an analog-to-digital converter including a two-bit delta-sigma modulator. The delta-sigma modulator is comprised of a first stage integrator that feeds a noise shaping circuit. The output of the noise shaping circuit is input to a two-threshold imbedded ADC to provide the two-bit output. This output of the imbedded ADC is input to a digital filter to provide the filtered digital output, this filtering high-frequency noise. The output of the imbedded ADC is also fed back through a three-level DAC to a summing junction on the input of the integrator. The three-level DAC has three states that are output with one state being a "do nothing" state. The thermal noise performance of the delta-sigma modulator as a function of the quantizer threshold voltages is first simulated and then the value of the quantizer thresholds selected to provide optimum signal-to-thermal noise performance.

Furthermore Thompson has published: "A Digitally-Corrected 20*b* Delta-Sigma Modulator", C. D. Thompson, S. R. Bernadas, *ISSCC*, 1994, pp 194-195.

IEEE Press/John Wiley &Sons Inc., 2005, ISBN 0-471-46585-2 "Understanding Delta Sigma Data Converters" by R. Schrier and G. C. Temes, particularly chapter 6 sections 6.3 and 6.4 for general overview of DEM and mismatch shaping and key references.

IEEE Press, 1997, ISBN 0-7803-1045-4 "Delta Sigma Data Converters: Theory, Design and Simulation" by S. R. Norsworthy, R. Schrier and G. C. Temes, particularly chapter 8 section 3 for multi-bit converter linearity techniques, general overview and key references.

IEEE Trans. Circuits and Systems-II, Vol. 42, No. 12, December 1995, pp 753-762 "Linearity Enhancement of Multi-bit $\Delta\Sigma$ A/D and D/A Converters Using Data Weighted Averaging" by R. T. Baird and T. S. Fiez, introducing Data weighed Averaging (DWA) rotational DEM method.

IEEE Trans. Circuits and Systems-II, Vol. 47, No. 11, November 2000, pp 1137-1144, "Techniques for Preventing Tonal Behavior of Data Weighted Averaging Algorithm in $\Delta$-$\Sigma$ Modulators" by M. Vadipour, discusses ways to suppress tones that can be generated by the DWA algorithm.

FIG. 1 prior art shows a typical implementation for a level N+1 level multi-bit DAC using the well known direct charge transfer (DCT) method. The implementation shown is single-ended though differential implementations and their relative advantages are obvious and well-known to practitioners. This DAC generates a multi-level output by combining N elements with two output levels (here V+ and V−) as controlled by the binary digit inputs D1-DN.

D1-DN are single bit binary inputs which may be derived by, for example, but not limited to, decoding a binary weighted digital input to the DAC (e.g. a M bit binary input could be expanded to a $N=2^M$ bit population code such as thermometer code). CK1 and CK2 are simplified-for-illustration non-overlapping clocks used to transfer charge from the reference voltages V+ and V− to the output capacitor COUT; various S/C circuit clocking schemes and their advantages are well-known to practitioners. Capacitors C1 to CN have equal capacitances. This DAC has N+1 analog levels.

In case the DAC is clocked repeatedly with m (m can take values 0, 1, ..., N) of the DN inputs set to 1 and the remaining bits set to 0 then the steady state output voltage of the DAC is:

$$Vout = (V-) + \frac{m}{N} \times (V+ - V-) = \frac{n}{M} \times (V+) + \frac{1-m}{N} \times (V-)$$

As m of the input capacitors C1-CN are being switched repeatedly between Vout and V+, the charge drawn from the V+ reference voltage on each cycle is thus:

$$Q += m \times C \times \Delta V = m \times C \times (V+ - Vout) = (V+ - V-) \times m \times C \times \left(1 - \frac{m}{N}\right),$$

where C is the nominal value of each of the C1-CN capacitor units. It can be shown that the charge Q− injected into the negative reference voltage V− has the same magnitude as Q+ (as would be hoped under steady-state otherwise the DAC is accumulating charge!). the reference charge is a quadratic function of the DAC input code, m. It is zero for m=0 and M=N and reaches a maximum for m=N/2 if N is even, otherwise it is maximum for m=N/2+/−0.5. The example of FIG. 2 prior art shows reference charge Q+ versus DAC input code for the case N=32.

Similar quadratic expressions can be derived for the reference charges Q+ and Q− in differential DAC implementations.

A well known problem with dependency of the reference charge on the DAC input code is that providing this charge requires a current to flow from or to the reference voltage source, and this current flow can modify the reference voltage through interaction with the reference sources output impedances (e.g. ohmic drop). Any signal-dependent variation of the reference voltages with changing DAC input causes non-linearity of the DAC analog output versus digital input code transfer function, and subsequent distortion of any signals being converted to analog. It is thus desirable to reduce reference current variation to reduce distortion (see prior art patents referenced).

A further well-known serious problem with multi-bit S/C (and current steering) DACs is that the individual DAC unit elements, C1-CN, cannot be manufactured to be exactly equal, but will have unavoidable random variations from ideal ("mismatches") due to manufacturing variations. These mismatches can cause nonlinearity of the DAC transfer function and hence distortion of any digital signals being converted to analog. Various techniques are known to reduce the distorting effect of these mismatches, such as trimming, digital correction and DEM. DEM methods use scrambling techniques to vary the order in which the DAC elements are used every time a digital input code is presented, such that the energy in the DAC output spectrum caused by the mismatches appears as out-of-band noise instead of causing in-band distortion or noise. Various DEM methods for DACs constructed with 2-level unit elements (e.g. switched capacitor DACs with only two reference voltages V+ and V−) are well known to practitioners (as described by prior art references above).

The Data Weighted Averaging (DWA) method scrambles the DAC elements by selecting adjacent elements rotated circularly by the number of elements used as outlined in IEEE Trans. Circuits and Systems-II, Vol. 42, No. 12, December 1995, pp 753-762 "Linearity Enhancement of Multi-bit ΔΣ A/D and D/A Converters Using Data Weighted Averaging" by R. T. Baird and T. S. Fiez. This converts the effects of mismatches to a first-order shaped noise in the DAC output spectrum. FIG. 3 prior art shows an example of the DWA algorithm applied to a multi-bit DAC constructed using 8 elements with 2-levels per element (+1 and −1 indicate the DAC element state, e.g. a capacitor element switched to V+ or V− in S/C DAC implementations).

As outlined above, techniques which reduce the current from the reference can reduce distortion and power. It is a challenge for the designers of DACs to reduce therefore the peak reference current significantly compared to prior art.

SUMMARY OF THE INVENTION

A principal object of the present invention is to achieve methods and systems to achieve a multi-bit delta-sigma DAC having a reduced power consumption.

A further object of the present invention is to achieve a rotation-based first order noise-shaping Dynamic Element matching technique for use with 3-level DAC unit elements, being independent of a specific DAC implementation method.

A further object of the present invention is to achieve a differential switched capacitor DAC implementation, which enables use of a tri-level DEM algorithm.

A further object of the present invention is to achieve a multi-bit delta-sigma DAC having a reduced peak reference current and a reduced reference loading.

A further object of the present invention is to reduce power consumption and voltage droop of a delta-sigma DAC.

Another object of the present invention is reduce circuit complexity required to implement a N-bit delta-sigma DAC.

Moreover an important objective of the invention is to achieve low distortion in spite of variations of circuit elements In accordance with the objects of this invention a method for a rotation-based first order noise-shaping DEM technique for use with 3-level DAC unit elements has been achieved. The method invented comprises, firstly, the following steps: (1) providing a multi-bit DAC, constructed from three-level state elements, wherein these state elements comprise a positive element, a negative element, and a mid-point element, (2) setting factor N=(number of analog levels of the DAC)−1, (3) setting a variable indicating a next element pointer (last) to: NE pointer (last)=0, and (4) setting a variable m=DAC digital input code (0<=m<=N), and (5) calculating S=2xm−N. The next process steps comprise (6) checking if S>0 and, if so, setting number of positive state elements to S and go to step (8), else go to step (7), (7) checking if S<0 and, if so, setting number of negative state elements to absolute value of |S|, else go directly to step (8), and (8) setting number of mid-point state elements to absolute value of N−|S|. The last steps of the method comprise (9) rotating next element selection pointer by moving next element selection pointer to: NE pointer (new)=NE pointer (last)+|S| mod N, (10) checking if all DAC input codes are applied, and if so, go to step (11), else switch to next DAC input code m and go to step (4); and (11) exit.

In accordance with the objects of this invention a method to reduce reference loading with advantages of reduced power and voltage droop when a tri-level scheme is applied to switched capacitor (S/C) DAC implementations has been achieved. The method invented comprises, firstly, the following steps: (1) providing a switched capacitor multi-bit DAC, constructed from three-level state elements, wherein these state elements comprise a positive element, a negative element, and an element corresponding to a mid-point element, (2) setting factor N=(number of analog levels of the DAC)−1, and (3) setting a variable m DAC digital input code (0<=m<=N). The next steps of the method are (4) checking if m≧N/2 and, if so, connecting 2m-N elements to the positive state reference and 2N-2m to the mid-point state reference and go to step (6), else go to step (5), (5) connecting N-2m capacitors to the negative state reference and connecting 2m capacitors to the midpoint state, and, finally, (6) exit.

In accordance with the objects of this invention a system to achieve a single-ended 3-level switched capacitor DAC implementation, driven by a rotation-based first-order noise-shaping Dynamic Element Matcher, having any number N+1 analog levels, has been achieved. The system invented comprises, firstly, N capacitors, wherein a first terminal of each capacitor is connected to a correspondent terminal of N arrangements of switches and a second terminal of each capacitor is connected to a first terminal of a sixth switching means and to a first terminal of a seventh switching means, and said N arrangements of switches, each comprising: a first switching means, wherein a first terminal is connected to a positive reference voltage and a second terminal is connected to second terminals of a second and third switching means and to the first terminal of the correspondent capacitor of said N capacitors, a second switching means, wherein a first terminal is connected to a mid-point reference voltage and a second terminal is connected to the second terminals of said first and third switching means, a third switching means, wherein a first terminal is connected to a negative reference voltage and a second terminal is connected to the second terminals of the first and third switching means, and a fifth switching means, being clocked by a second clocking pulse, wherein a first terminal is connected to an output of the DAC and a second terminal is connected to the first terminal of the correspondent capacitor of said N capacitors. Furthermore the system invented comprises the sixth switching means, being clocked by a first clocking pulse, wherein a second terminal is connected to a ground reference voltage, the seventh switching means, being clocked by the second clocking pulse, wherein a second terminal is connected to a first input of an amplifying means and to a first terminal of a feedback capacitor, The amplifying means, wherein a second input is connected to ground reference voltage and its output is the output of the DAC, and the feedback capacitor, wherein a second terminal is connected to the output of the amplifying means.

In accordance with the objects of this invention a system to achieve a differential 3-level switched capacitor DAC implementation, driven by a rotation-based first-order noise-shaping Dynamic Element Matcher, having any number N+1 analog levels, has been disclosed. The system invented comprises, firstly, a first half of the differential implementation comprising N capacitors, wherein a first terminal of each capacitor is connected to a correspondent terminal of N switching arrangements and a second terminal of each capacitor is connected to a first terminal of a sixth switching means and to a first terminal of a seventh switching means, and said N switching arrangements, each comprising: a first switching means, wherein a first terminal is connected to a positive reference voltage and a second terminal is connected to second terminals of a second and third switching means and to the first terminal of the correspondent capacitor of said N capacitors, a second switching means, wherein a first terminal is connected to a mid-point reference voltage and a second terminal is connected to said second terminals of said first and third switching means, a third switching means, wherein a first terminal is connected to a negative reference voltage and a second terminal is connected to said second terminals of said first and third switching means, and a fifth switching means, being clocked by a second clocking pulse, wherein a first terminal is connected to a first output of the DAC and a second terminal is connected to the first terminal of the correspondent capacitor of said N capacitors. Furthermore the system invented comprises the sixth switching means, being clocked by the first clocking pulse, wherein a second terminal is connected to a ground reference voltage, the seventh switching means, being clocked by the second clocking pulse, wherein a second terminal is connected to a first input of a differential amplifying means and to a first terminal of a first feedback capacitor, the differential amplifying means having said first and a second input and a first and a second output, wherein said outputs are differential outputs of the DAC, and the first feedback capacitor, wherein a second terminal is connected to the first output of said amplifying means. Moreover the system comprises a second half of the differential implementation comprising: a second set of N capacitors, wherein a first terminal of each capacitor is connected to a correspondent terminal of a second set of N switching arrangements and a second terminal of each capacitor is connected to a first terminal of an eighth switching means and to a first terminal of a ninth switching means, the second set of N switching arrangements, each comprising: a first switching means, wherein a first terminal is connected to a positive reference voltage and a second terminal is connected to second terminals of a second and third switching means and to the first terminal of the correspondent capacitor of said N capacitors, a second switching means, wherein a first terminal is connected to a mid-point reference voltage and a second terminal is connected to said second terminals of said first and third switching means, a third switching means, wherein a first terminal is connected to a negative reference voltage and a second terminal is connected to said second terminals of said first and third switching means, and a fifth switching means, being clocked by a second clocking pulse, wherein a first terminal is connected to the second output of the DAC and a second terminal is connected to the first terminal of the correspondent capacitor of said N capacitors. Furthermore the system invented comprises the eighth switching means, being clocked by the first clocking pulse, wherein a second terminal is connected to ground reference voltage, the ninth switching means, being clocked by the second clocking pulse, wherein a second terminal is connected to the second input of the differential amplifying means and to a first terminal of a second feedback capacitor, and said second feedback capacitor, wherein a second terminal is connected to the second output of said amplifying means.

BRIEF DESCRIPTION OF THE DRAWINGS

In the accompanying drawings forming a material part of this description, there is shown:

FIG. 1 prior art shows a typical switched capacitor (S/C) implementation for a N+1 level multi-bit DAC using the well-known direct charge transfer (DCT) method.

FIG. 2 prior art illustrates a dependency of a reference charge on a DAC input code.

FIG. 3 prior art illustrates a Data Weighted Averaging algorithm (DWA).

FIG. 9 illustrates a new DEM algorithm invented for a 3-level DAC.

DESCRIPTION OF THE PREFERRED EMBODIMENTS

The preferred embodiments disclose methods and systems to implement rotation—based Dynamic Element Matcher (DEM) techniques suitable for multi-bit DAC implementations. Unlike the well-known data weighted averaging (DWA) rotation method, described by the references above in the prior art section) and the majority of other known noise-shaping DEM algorithms, the method invented is applicable to DACs constructed from 3-level DAC elements.

Without a suitable DEM algorithm, using 3-level DAC elements would be impractical in most cases.

A key advantage of using 3-level elements is that in switched capacitor (S/C) DAC implementations, using 3-level DAC elements allows reduction of the maximum charge that the reference voltages must provide on any clock cycle, i.e. reduced reference currents. Reducing the reference currents offers twin benefits of reducing both power dissipation in the reference voltage generation (important for low-power DACs) and also reference voltage droop, which is a source of signal distortion.

A further advantage of the DEM method of the present invention is that for a DAC (not necessarily S/C) constructed using an even number of DAC elements, adjacent pairs of elements can be combined. It is thus possible to implement a DAC with any number N analog levels using fewer DAC elements and switches than required with 2-level DAC elements. Simplifying the circuit implementation can simply layout and, in S/C implementation, reduce charge injection errors if minimum size switches are used.

In the following the purpose and description of the new DEM method invented is explained in detail. Firstly the motivation to achieve a reduced reference loading is outlined.

The 3-level DAC implementation invented can reduce the reference loading in S/C DACs compared to 2-level implementations. The 3-level DAC element of the present invention assumes ideal equi-spaced reference voltage levels:

V+
VCOM=(V++V−)/2
V−

Figure 4:
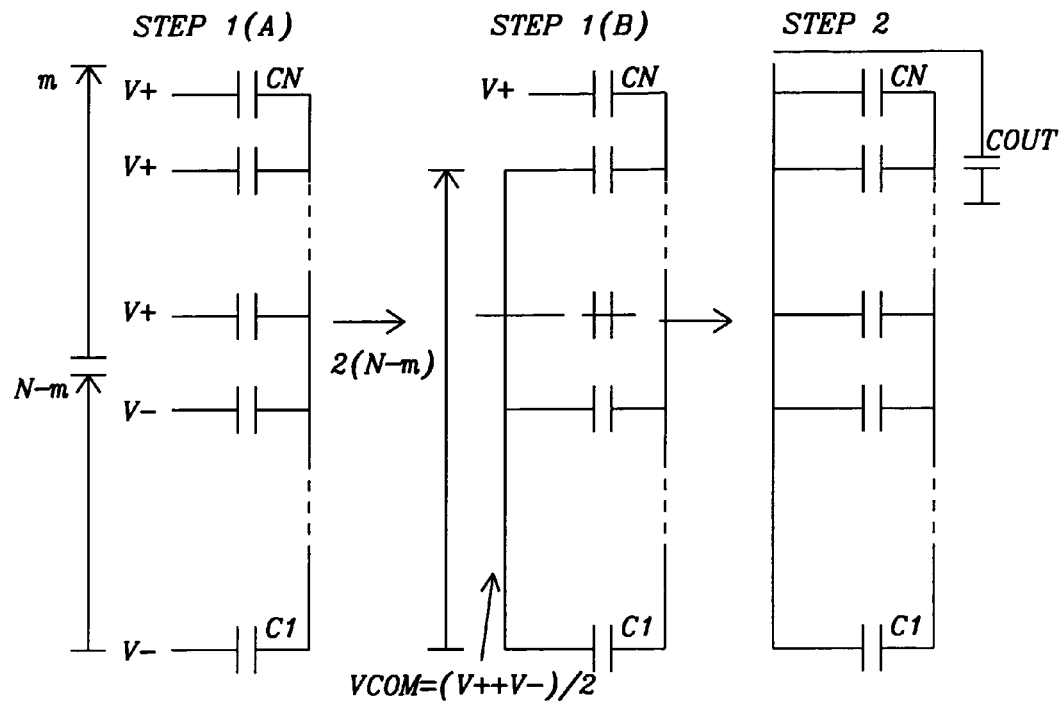
FIG. 4 illustrates how a DAC using 3-level elements can be derived from a DAC using 2-elements

FIG. 4 shows how a DAC implemented using three-level elements can be derived from a DAC implemented using two-level elements. FIG. 4 STEP 1(A) and STEP (2) show how the DAC elements would be switched with two-level elements for an example with m>N/2 (i.e. more capacitors switched to V+than V−) in a single-ended direct charge transfer (DCT) S/C DAC implementation. m signifies the number of capacitors switched to V+, while N signifies the total number of capacitors.

STEP 1(B) of FIG. 4 is not normally performed, but could be achieved as an intermediate step between STEP 1(A) and STEP 2 by noting that N-m capacitors are connected to V− in STEP 1(A). If these capacitors are first connected to N-m of the capacitors charged to V+, then charge sharing between the ideally equal capacitors gives a voltage VCOM=(V++V−)/2 at the common node VCOM indicated. Thus, if an ideal VCOM=(V++V−)/2 voltage was available, then STEP (1B) could be performed instead of and equivalent to STEP 1(A) by directly connecting 2(N-m) capacitors directly to VCOM and 2m-N capacitors to V+ voltage. A key advantage of doing this is that fewer capacitors now connect to V+(2m-N< for m≧N/2) and hence the reference charge drops from $$QA+=m \times C \times (V+-Vout)=m \times C \times (1-m/N) \times (V+-V-),$$

as required in prior art, to $$QB+=(2m-N) \times C \times (V+-Vout)=(2m-N) \times C \times (1-m/N) \times (V+-V-).$$

No charge is delivered by V− as no capacitors connect to it in STEP 1(B) for m≧N/2. If m<N/2 then it be similarly shown that no charge is required from the V+ reference and that only the V− reference must deliver charge similar to the charge required from V+voltage given above.

For a DAC with even N, no charge is required from either of V+ and V− when m=N/2 as all capacitors are switched to VCOM in STEP 1(B).

Figure 5:
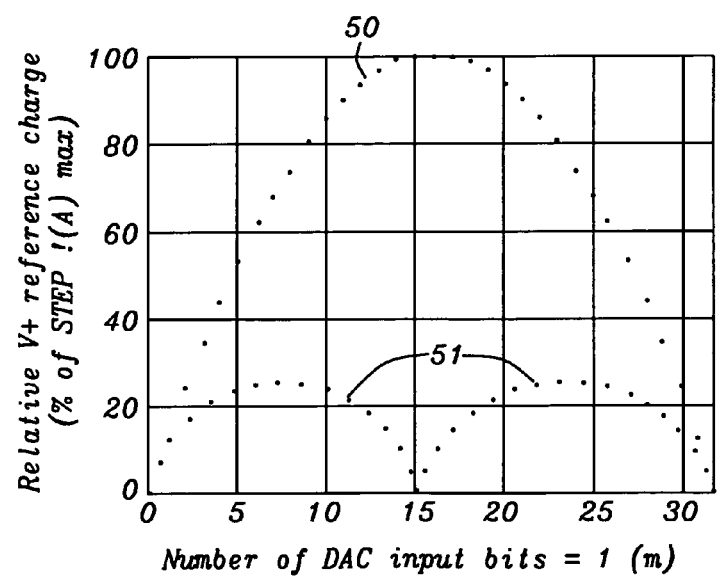
FIG. 5 illustrates a comparison of a Q+ reference charge required using 3-level DAC elements versus 2-level DAC elements for N=32.

FIG. 5 illustrates a comparison of a Q+reference charge required using 3-level DAC elements versus 2-level DAC elements for N=32. STEP 1(A) describes a 2-level DAC and STEP 1(B) describes a tri-level DAC. FIG. 5 compares the Q+(Q− is identical) reference charge supplied at steady state versus input code for a differential DAC with N=32 capacitors implemented using both STEP 1(A) and STEP 1(B) (Q+ is now non-zero for m<N/2 as one side of a differential DAC must always connect to V+, giving symmetry around m=N/2).

FIG. 5 illustrates a key point of the present invention. In FIG. 5 the Q+ reference charge required using Step 1(B), shown in curve 51, is compared versus the reference charge required using STEP 1(A), shown in curve 50. The vertical coordinate shows the relative V+ reference charge required in percentage of reference charge required using STEP 1(A). It can be seen that the peak reference charge (and hence the current) using STEP 1(B) is only 25% of that using STEP 1(A). Thus any ohmic drop of the reference voltage is reduced by 75% and power delivered by V+ is reduced by 75%. These 75% reductions are general and not specific to the example N=32.

This can be proven by finding and comparing maximum values of QA+ and QB+:

Using STEP 1(A):

$$dQA+/dm = C \times (V+-V-) \times (1-2m/N) = 0 \text{ (}1^{st}\text{ derivative to find maximum)}$$

results in maximum value for:

m=N/2 and hence

QA+(max)=(V+−V−)×N×C/2.

Furthermore using STEP 1(B)

$$dQB+/dm = C \times (V+-V-) \times (3-4m/N) = 0 \text{ (1}^{st}\text{ derivative to find maximum)}$$

results in maximum value for:

m=3N/4 and hence

QB+(max)=(V+−V−)×N×C/8=QA+(max)/4, (i.e. 75% less than using STEP 1(A)!).

It should be noted that the methods invented could be applied to current-steering DAC implementations as well.

Figure 6:
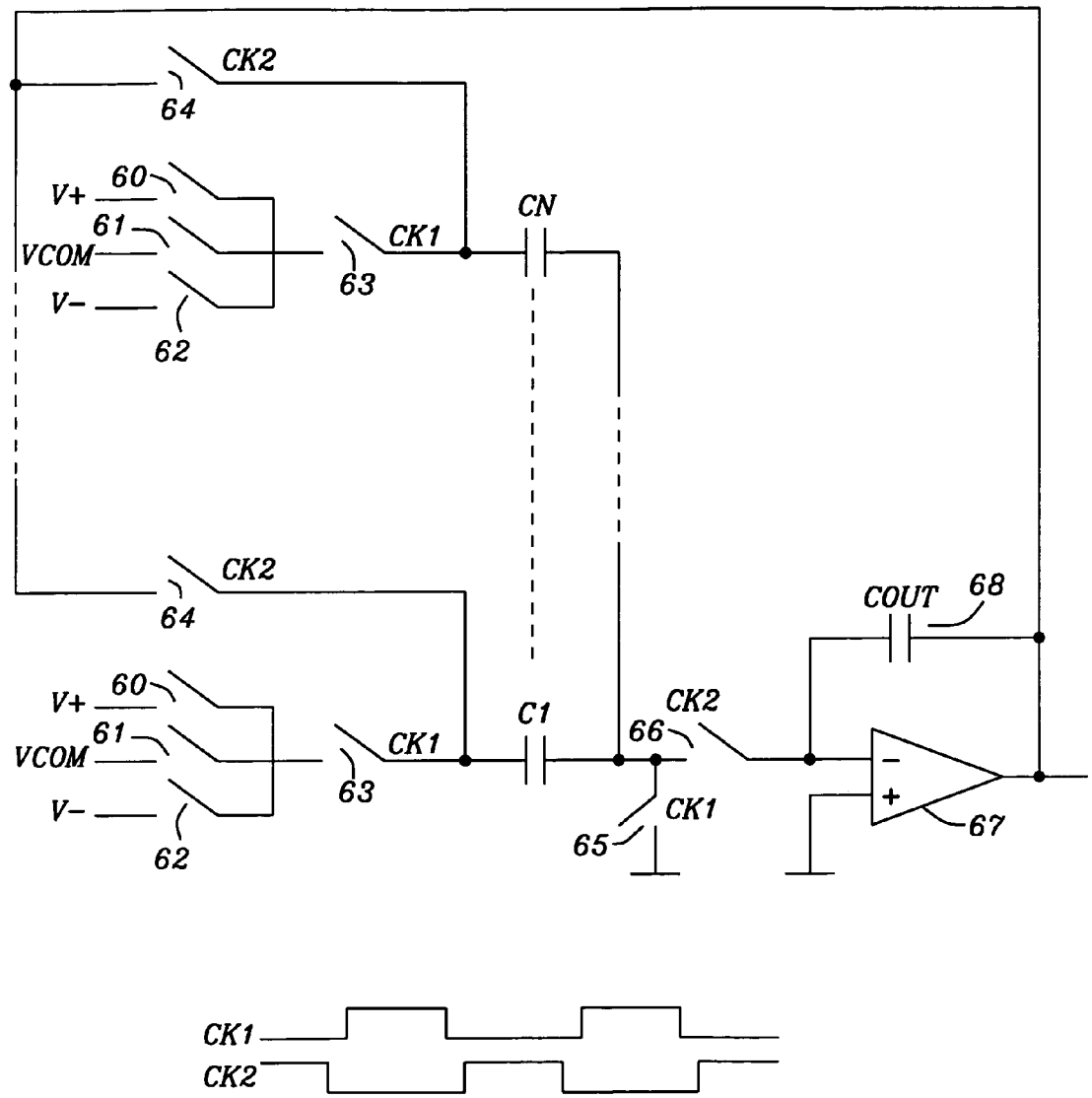
FIG. 6 illustrates a single-ended 3-level DAC implementation of the present invention.
Figure 7:
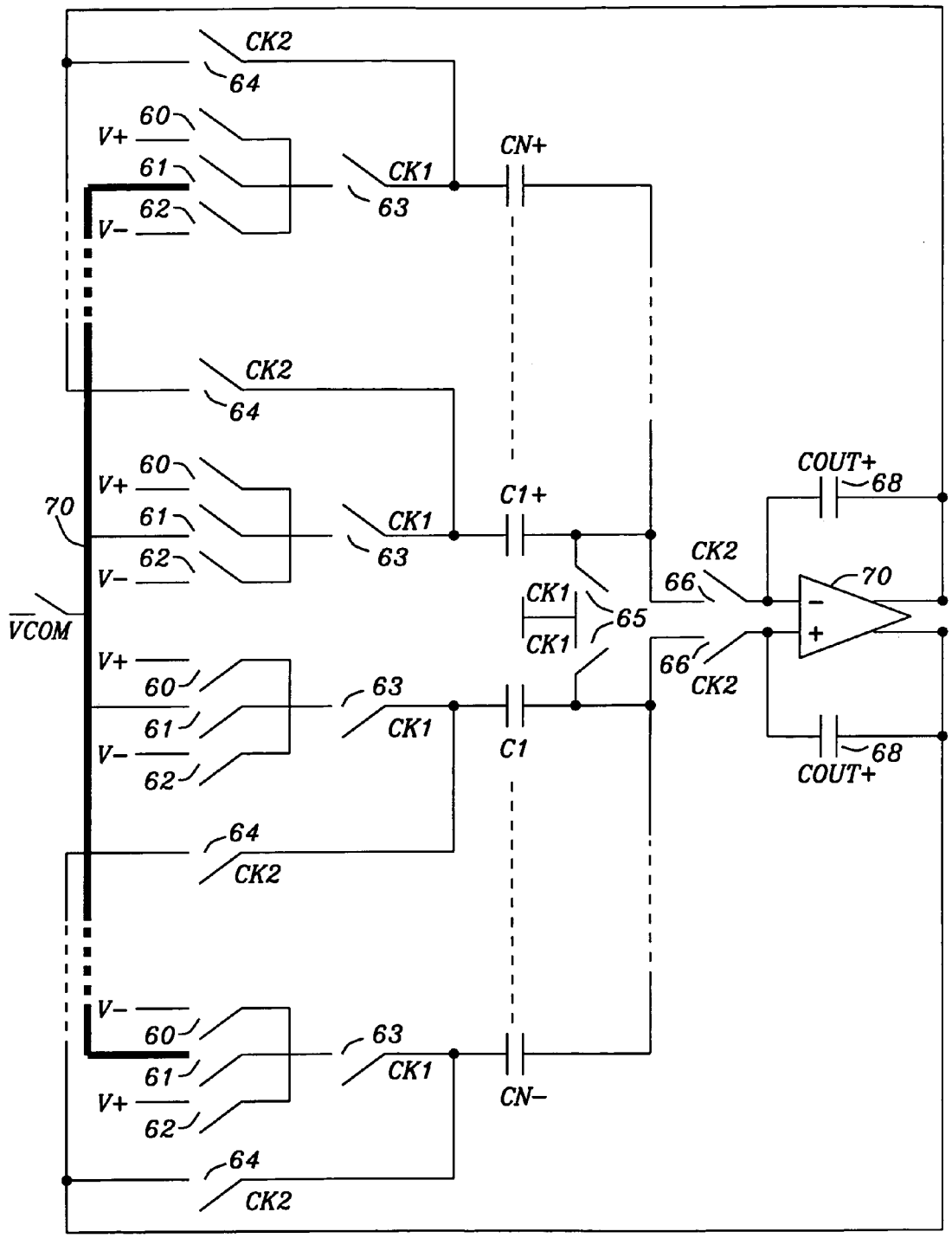
FIG. 7 shows a differential 3-level DAC variant with optional VCOM reference source of the present invention.

FIG. 6 and FIG. 7 show possible single ended and differential implementations of S/C DACs using the 3-level element of the present invention.

FIG. 6 shows a single ended DAC having N+1 analog levels. N DAC elements give N+1 levels because the count starts with zero until N. The single-ended DAC comprises N capacitors C1-CN and N arrangement of switches, each comprising a first switch 60 connected to positive reference voltage, a second switch 61 connected to a mid-point reference voltage, a third switch 62 connected to a negative reference voltage, a fourth switch 63, clocked by clocking pulse CK1 shown also in FIG. 6, and deployed between the switches 60-62 and a correspondent capacitor of the capacitors C1-CN, and a fifth switch 64 clocked by clocking pulse CK2 shown also in FIG. 6, and deployed between the switches 60-62 and a correspondent capacitor of the capacitors C1-CN. Furthermore the single-ended DAC comprises a sixth switch 65, clocked by the clocking pulse CK1, deployed between second terminals of the capacitors C1-CN and a ground reference voltage, and a seventh switch 66, clocked by the clocking pulse CK2, deployed between second terminals of the capacitors C1-CN and a first input terminal of a differential amplifier 67. An output feedback capacitor COUT is deployed between an output of the amplifier 67 and its first input terminal.

Instead of the ground reference voltage another suitable reference voltage could be used as well. This applies for the single ended DAC and also for the differential DAC.

As a second embodiment the fourth switch 63 can be omitted, provided the three switches 60-62 are open when clocking pulse CK1 is low. This can be arranged with the control logic of switches 60-62.

Furthermore, switches 65 and 66 can use clocks, which are slightly time-advanced relative to CK1 and CK2, i.e. switch 65 would be controlled by a clock that rises slightly before CK1 rises and falls slightly before CK1 falls.

FIG. 7 shows a differential DAC having N+1 analog levels. The same numerals for switches having the same functions as outlined in FIG. 6 have been used in FIG. 7 as well. There are now have twice as many capacitors in total (2N), the halves of the differential implementation will act as mirror images of each other and so there are still N+1 output levels The amplifier 70 has two output terminals.

As outlined above for the single ended DAC the fourth switch 63 can be omitted, provided the three switches 60-62 are open when clocking pulse CK1 is low. This can be arranged with the control logic of switches 60-62.

Likewise, switches 65 and 66 can use clocks, which are slightly time-advanced relative to CK1 and CK2, i.e. switch 65 would be controlled by a clock that rises slightly before CK1 rises and falls slightly before CK1 falls.

It should be noted that the differential implementation is much preferred for the following key reasons:

VCOM can be created by shorting capacitors from both sides of the differential circuit as shown by the thick line 70 of FIG. 7. Thus an additional circuit with attendant power dissipation to generate VCOM is not required.

Deviations of VCOM from exactly (V+−V−)/2 are cancelled by the differential nature of the circuit. This is of paramount importance in achieving low distortion as it may be very difficult to generate the mid-point reference exactly midway between the other two references in practice. FIG. 8 a-c show the differential cancellation of VCOM errors in detail.

Figure 16:
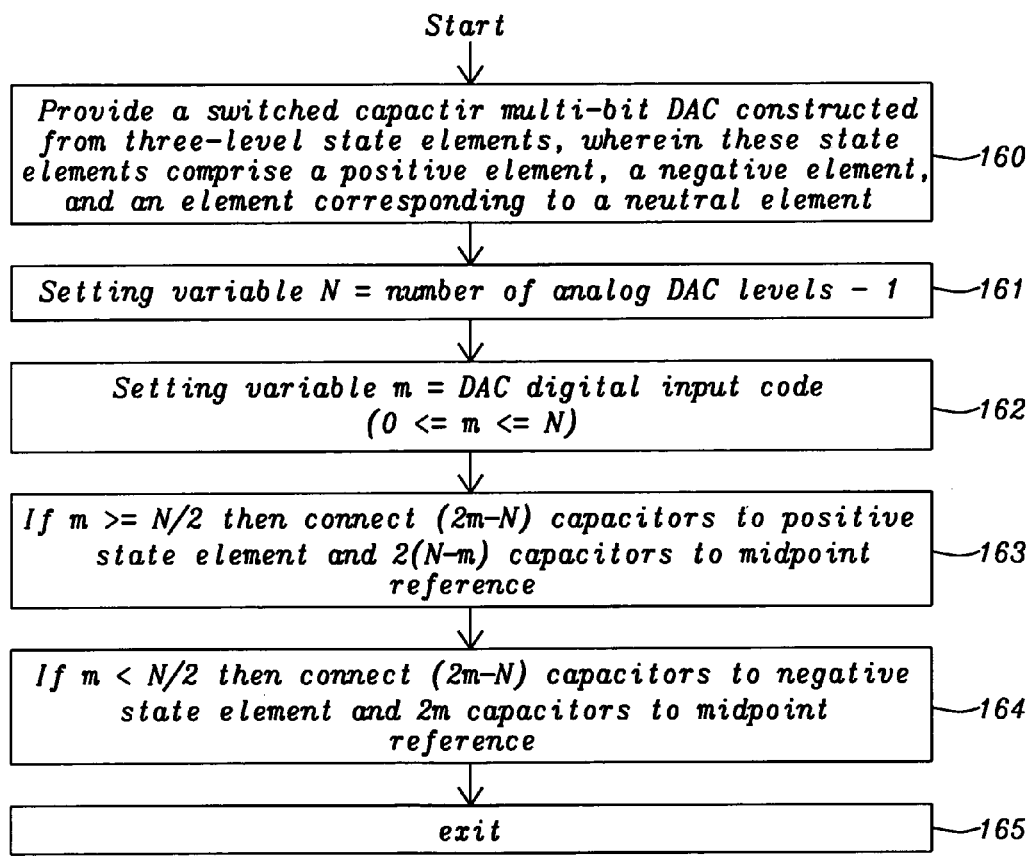
FIG. 16 illustrates a flowchart of a method invented to reduce reference loading with advantages of reduced power and voltage droop when a tri-level scheme is applied to switched capacitor (S/C) DAC implementations.

FIG. 16 illustrates a flowchart of a method invented to reduce reference loading with advantages of reduced power and voltage droop when a tri-level scheme is applied to switched capacitor (S/C) DAC implementations. Step 160 illustrates the provision of a switched capacitor multi-bit DAC, constructed from three-level state elements, wherein these state elements comprise a positive element, a negative element, and an element corresponding to a mid-point element. Step 161 illustrates the setting of factor N=(number of tri-level elements of the DAC)−1. Step 162 shows the setting of variable m=DAC digital input value (0≦m≦N). Step 163 describes checking if m>=N/2 and, if so, connecting (2-N) capacitors to the positive state reference and connecting 2(N-m) capacitors to the mid-point reference and go to step 165. Step 164 illustrates checking if m<N/2 and, if so, connecting (N-2m) capacitors are switched to the negative state reference and connecting 2m capacitors to the mid-point state reference and go to step 165. Step 165 is the exit step for the switching connections of the DAC.

Figure 8A:
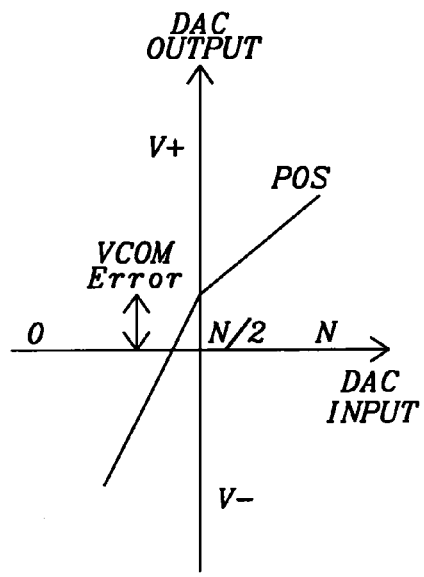
FIG. 8 *a-c* illustrate multiple differential cancellations of VCOM errors.
Figure 8B:
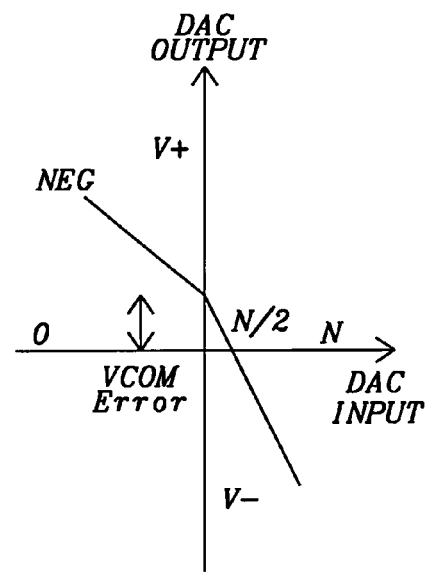
Figure 8C:
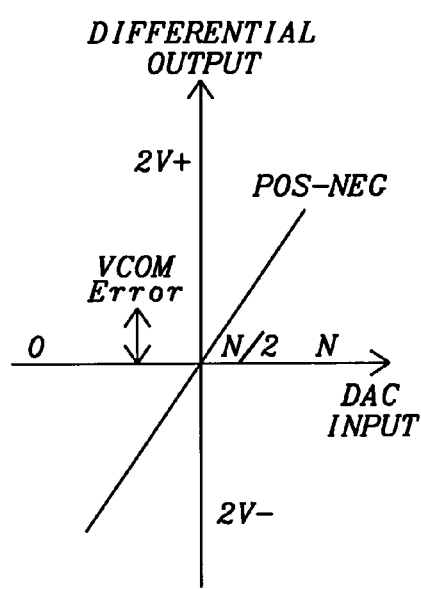

FIG. 8a shows a DAC output wherein a differential circuit has a non-linearity on the positive side caused by a VCOM error. FIG. 8b shows a DAC output wherein a differential circuit has a non-linearity on the negative side caused by a VCOM error, while FIG. 8c shows an differential DAC output wherein a positive/negative difference cancels VCOM error component common to both sides.

While the reduced reference loading motivation of the present invention was outlined above, follows now a detailed description of the new DEM algorithm invented:

A DAC implemented per STEP 1(B) uses 3-levels per DAC element with states V−, VCOM and V+; standard 2-level DEM matching methods such as DWA do not give noise-shaped DEM when applied to such DACs and hence a new tri-level DEM algorithm is required to make them practical (distortion caused by mismatches will almost certainly be unacceptable without DEM for most applications). FIG. 9 shows an example of a new rotation-based DEM method invented (example for N=8).

Now follows a description of the new DEM algorithm invented and a comparison with the DWA method.

For both DWA and its variants and the new DEM algorithm presented, it is usual (though not essential) for the digital input bits D1-DN to be presented as a thermometer code, i.e. all DAC elements, set to the same state, occupy adjacent D1-DN bit positions (as shown in FIG. 3 prior art for an example for DWA), not scattered throughout the D1-DN bit positions.

For standard DWA with 2-level element, the number of elements connected to the +1 state (e.g. V+ for a S/C DAC) and the −1 state/e.g. V− for a S/C DAC) for input code m is:

+1 state elements = m
−1 state elements = N − m and the DWA algorithm rotates next element (NE) selection pointer by (see FIG. 3 for an example):

NE pointer (new)=(NE pointer (last)+m) mod N
(modulo operation)

For the new tri-level method invented, first the quantity $S=2m-N$ is computed. Then
If S>0, number of state +1 state elements (e.g. V+ in a S/C DAC)=S
If S<0, number of state −1 state elements (e.g. V− in a S/C DAC)=|S|

It should be noted that there are never different elements present set to states +1 and −1 at the same time, only ever (+1), (+1 & VCOM), (VCOM), (−1 & VCOM), and (−1) combinations arise. The next element selection pointer now moves by:

NE pointer (new)=(NE pointer (last)+|S|) mod N

FIG. 9 shows an example of the new invented DEM algorithm element selection and state connection for the case N=8 (a 9-level DAC).

Another key point is that the pointer now always moves by multiples of 2 DAC elements. Thus for even N, the same adjacent element pairs will be repeatedly set to identical states as the pointer wraps around, and thus it is possible to combine them into one element, gaining key benefits from sharing their switches in S/C DAC implementations. The advantages are
  reduced circuit complexity and switch signal routing
  reduced switch feed-through and charge injection errors if minimum size switches are used.

Figure 15:
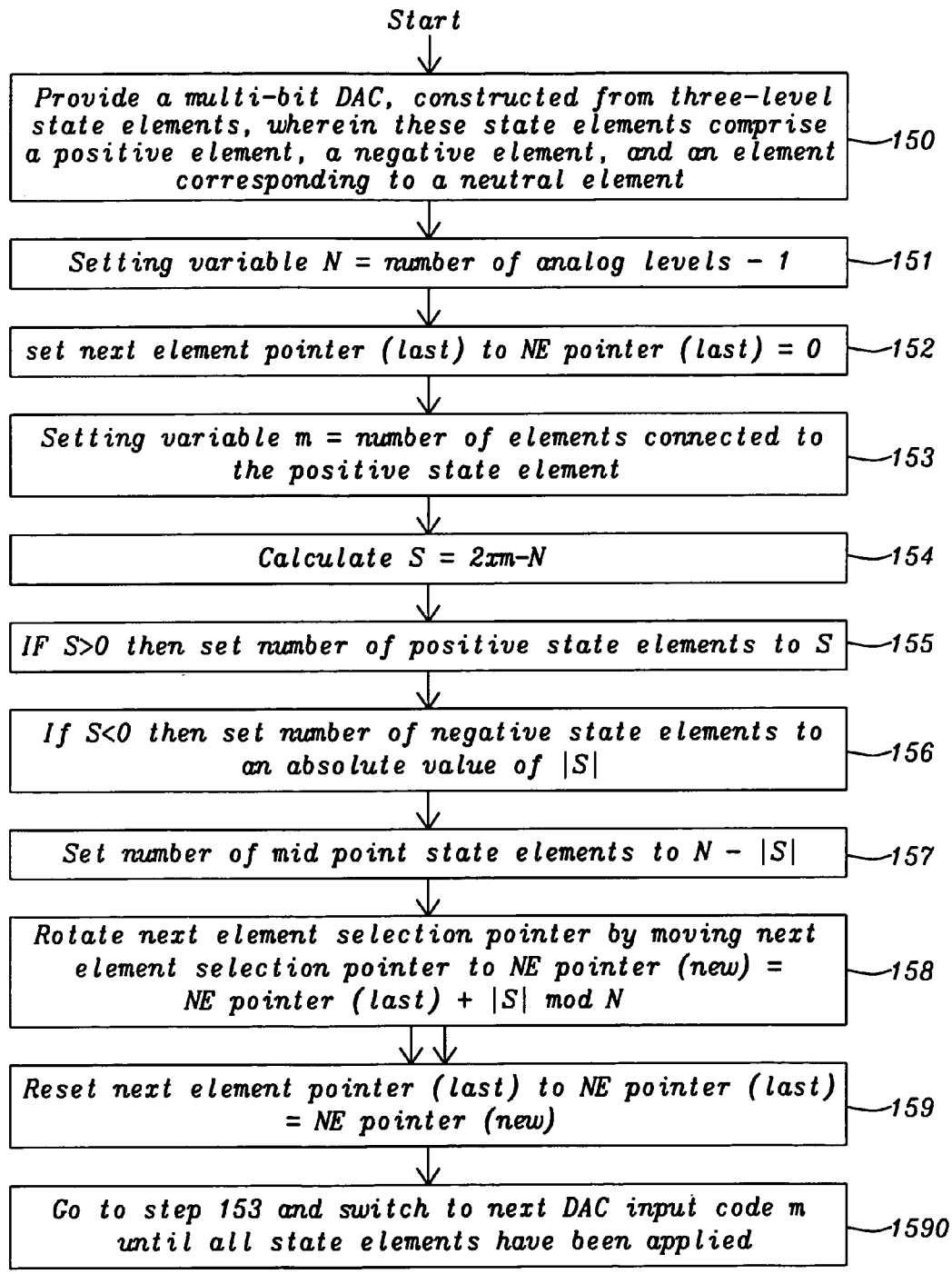
FIG. 15 illustrates a flowchart of a method invented for a rotation-based first order noise-shaping DEM technique for use with 3-level DAC unit elements.

FIG. 15 illustrates a flowchart of a method invented for a rotation-based first order noise-shaping DEM technique for use with 3-level DAC unit elements. Step 150 describes the provision of a multi-bit DAC, constructed from three-level state elements, wherein these state elements comprise a positive element, a negative element, and a mid-point element. Step 151 illustrates the setting of factor N=number of tri-level elements of the DAC−1 and in step 152 the variable "next element pointer (last)" is set to: NE pointer (last)=0. Step 153 comprises the setting of variable m=DAC digital input value (0<=m<=N).

In step 154 the factor S=2xm−N is calculated. Step 155 is a check if S>0 and, if so, setting the number of positive state elements to S and go to step 157, otherwise go to step 156. Step 156 is a check if S<0 and, if so, setting the number of negative state elements to the absolute value of |S| and go to step 157, otherwise the process flow goes directly to step 157. Step 157 describes setting the number of mid-point state elements to N−|S|. In step 158 a next element selection pointer is rotating by moving next element selection pointer to: NE pointer (new)=NE pointer (last)+|S| mod N. In step 159 the next element pointer (last) is reset to NE pointer (last)=NE pointer (new) and in step 1590 the process flow goes back to step 153 and switches to next DAC input code m until all state elements have been applied.

It should be understood that other rotation based techniques than the preferred embodiment described above are possible as well.

There are alternative embodiments of the DEM method of the present invention possible, below are some examples, but not limited to, of such alternative embodiments of the DEM methods.

1. Any tri-level DEM method variants of the present invention based on DWA techniques intended to suppress tonal DWA behaviour, such as:
  "randomized DWA" (see Vadipour reference of prior art section (IEEE Trans. Circuits and Systems-II, Vol. 47, No. 11, November 2000, pp 1137-1144, "Techniques for Preventing Tonal Behavior of Data Weighted Averaging Algorithm in Δ-Σ Modulators" by M. Vadipour
  adding modulator dither
  adding extra elements to change tone frequencies,
as these are easily created by applying the relevant DWA modifications to the new DEM algorithm invented.

2. Variants of the new tri-level DEM method invented in which the rotation algorithm spans both sides of a differential circuit as one large capacitor bank instead of using 2 separate independently-rotated capacitor banks for each side of the circuit (i.e. elements marked C1+ to CN+ and C1− to CN− are swapped between the positive and negative sides of the differential DAC shown in FIG. 7 instead of being always allocated to one side).

3. Extensions of the new 3-level DEM algorithm invented to a DAC construction using M-level elements by any recursive application of the new 3-level DEM algorithm to create new DAC reference levels positioned between existing levels.

4. Combinations of the new DEM algorithm invented with other switching arrangements (DEM or non DEM), such as a combination with the (non-DEM) constant reference loading described by patents of applicant Wolfson Microelectronics PLC, such as U.S. Pat. No. 6,952,176 and U.S. Pat. No. 6,573,850 cited earlier.

Figure 10:
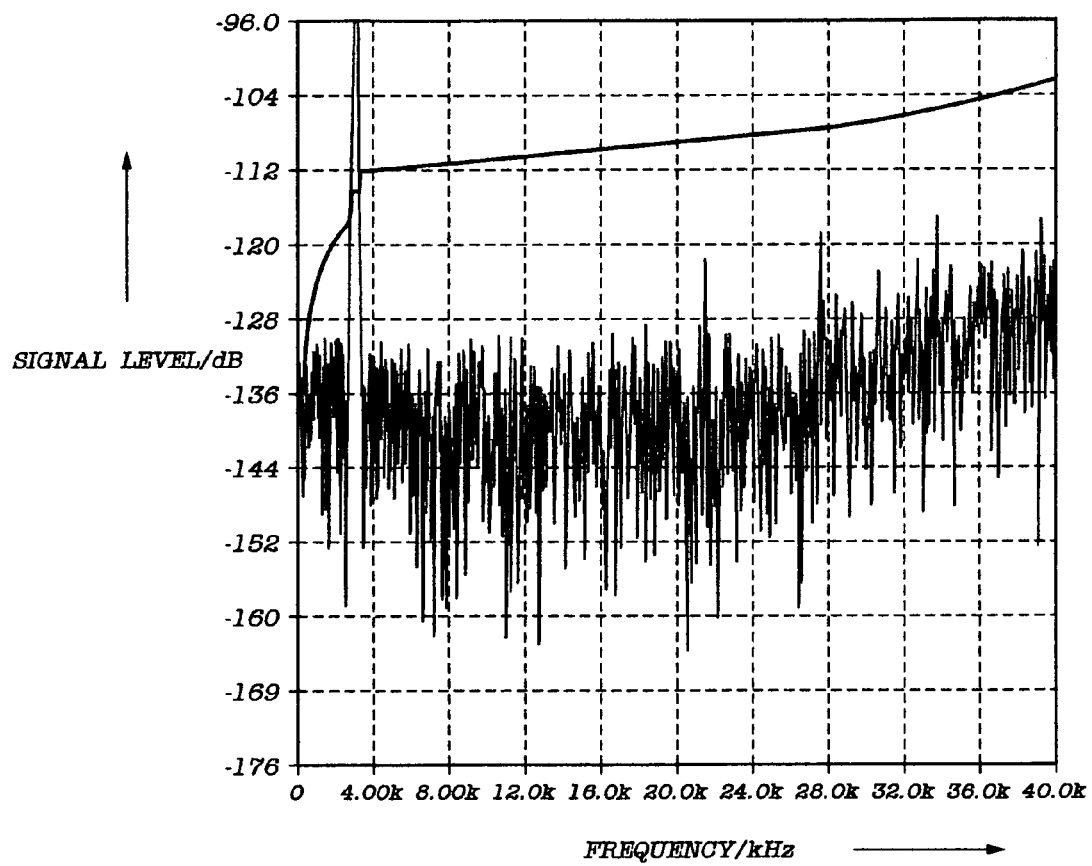
FIG. 10 shows signal-band noise floor detail for differential DAC 2-level elements and DWA DEM.
Figure 11:
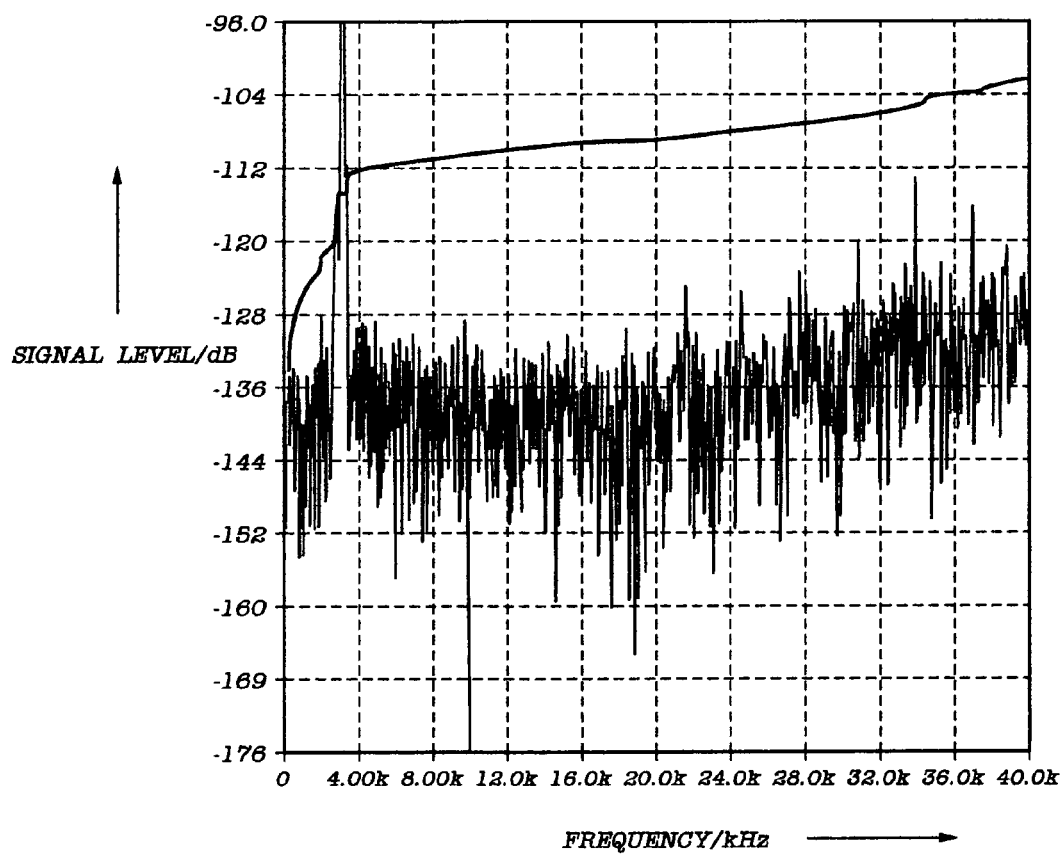
FIG. 11 illustrates signal-band noise floor detail for differential DAC 3-level elements and new DEM algorithm used

As proof-of concept FIG. 10 and FIG. 11 show noise floor details to 40 kHz for two differential DAC implementations with N=32 (i.e. 33 output levels each DAC) with 2-level DAC elements and DWA DEM and 3-level implementations as per FIG. 7 using the new DEM algorithm invented. FIG. 10 shows signal-band noise floor detail for differential DAC 2-level elements and DWA DEM, while FIG. 11 illustrates signal-band noise floor detail for differential DAC 3-level elements and new DEM algorithm used. All DAC elements have Gaussian deviations from ideal with a standard deviation of 0.5%. Both DACs of FIG. 10 and FIG. 11 are driven by a 5-bit $3^{rd}$-order delta delta-sigma modulator with 64K oversampling (for a 24 kHz signal band) and the modulator is dithered.

Figure 12:
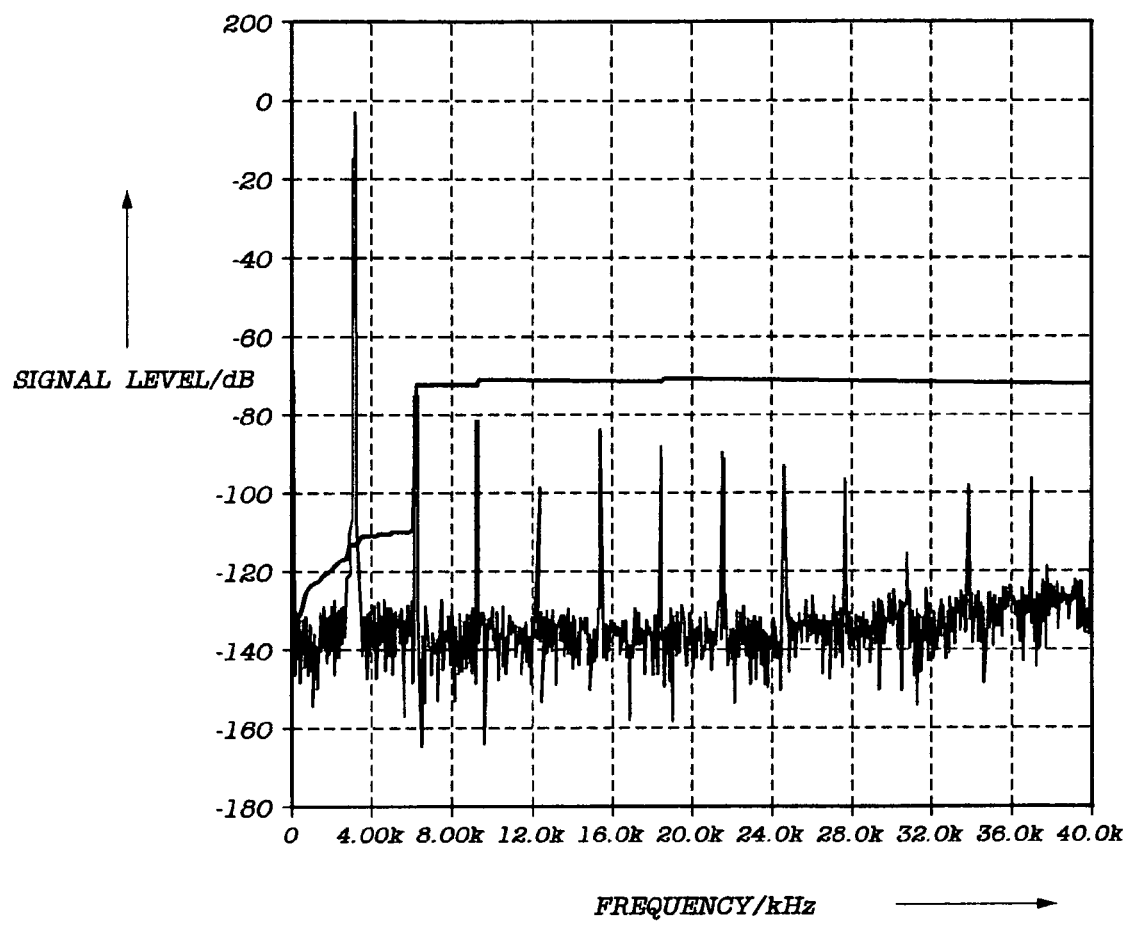
FIG. 12 shows total harmonic distortion for a 2-level DAC with DEM disabled
Figure 13:
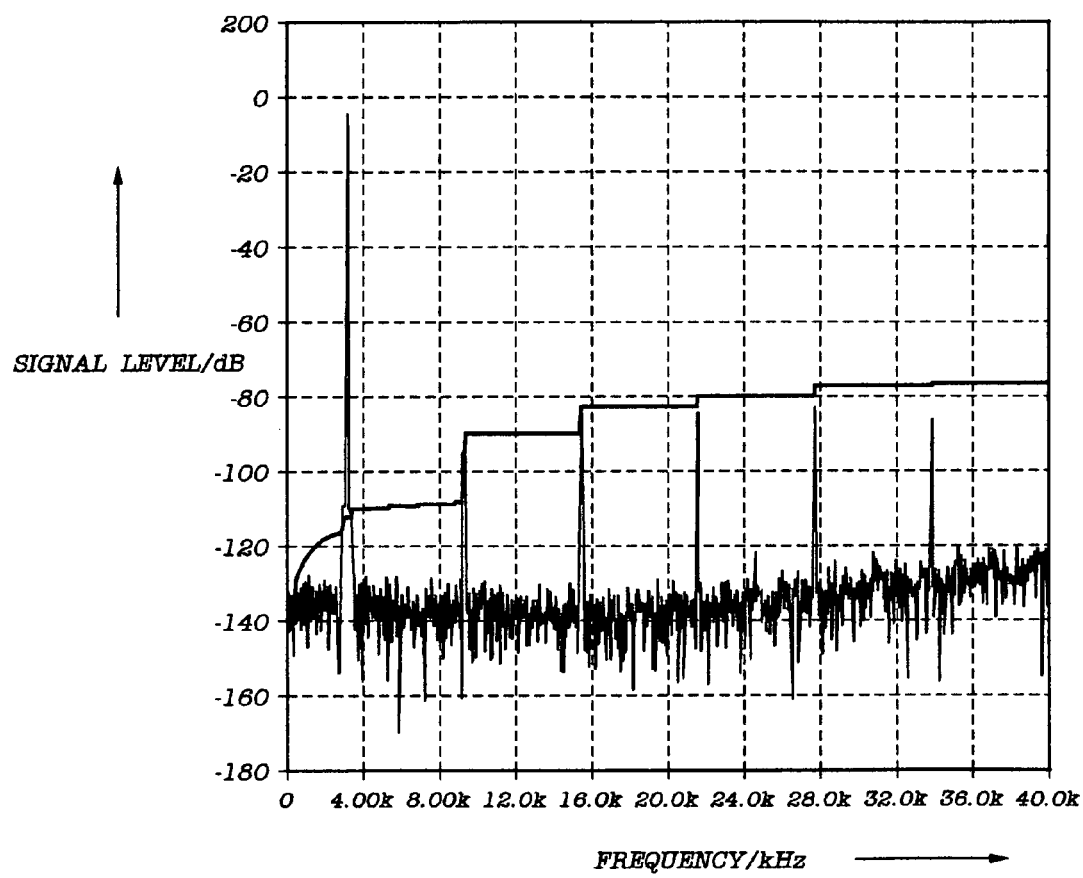
FIG. 13 illustrates total harmonic distortion for a tri-level DAC with DEM disabled.

FIG. 12 shows total harmonic distortion (THD) for a 2-level DAC with DEM disabled while FIG. 13 illustrates THD for a 3-level DAC also with DEM disabled. Both FIGS. 12-13 illustrate the need for DEM to deal with typical mismatch levels to achieve low distortion.

Figure 14:
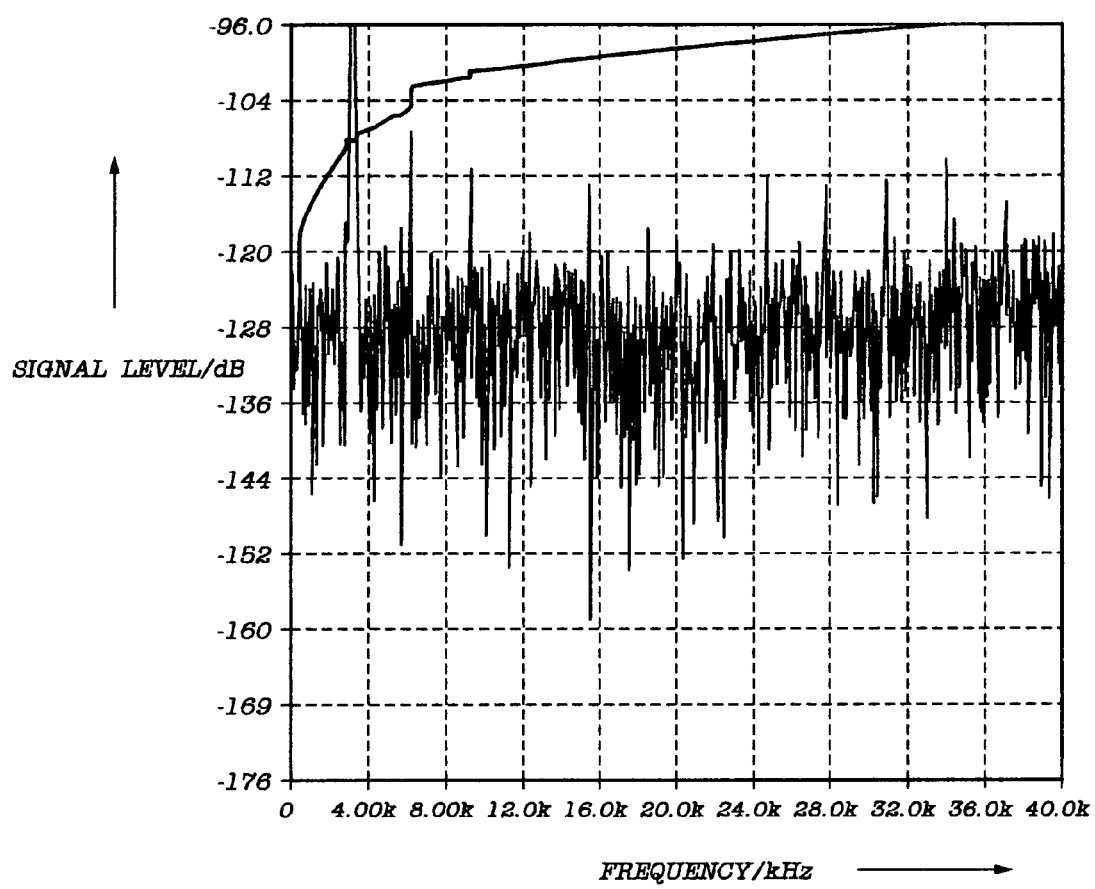
FIG. 14 illustrates signal-band noise floor detail for tri-level DAC with standard 2-level DWA DEM applied.

FIG. 14 illustrates signal-band noise floor detail for tri-level DAC with standard 2-level DWA DEM (i.e. moving the element selection pointer by m) applied to the tri-level DAC instead of the new DEM algorithm invented (i.e. moving the pointer by |S|). FIG. 14 clearly illustrates that standard DWA will not work for a DAC with tri-level elements. The DAC of FIG. 14 is linearized by the randomizing effect of the DWA rotation, but the elevated, flat noise floor shows that noise shaping is not achieved, with consequent degradation of signal-to-noise ratio, confirming the need for the new DEM algorithm invented.

While the invention has been particularly shown and described with reference to the preferred embodiments thereof, it will be understood by those skilled in the art that various changes in form and details may be made without departing from the spirit and scope of the invention.

What is claimed is:

1. A method for a rotation-based first order noise-shaping DEM technique for use with 3-level DAC unit elements comprising the following steps:
    (1) providing a multi-bit DAC, constructed from three-level state elements, wherein these state elements comprise a positive element, a negative element, and a mid-point element;
    (2) setting factor N=(number of analog levels of the DAC)−1;
    (3) setting NE pointer (last)=0;
    (4) setting a variable m=DAC digital input code (0<=m<=N);
    (5) calculating a reference S=2xm−N;
    (6) checking if S>0 and, if so, setting number of positive state elements to S and go to step (8), else go to step (7);
    (7) checking if S<0 and, if so, setting number of negative state elements to absolute value of |S|, else go directly to step (8);
    (8) setting number of mid-point state elements to absolute value of N−|S|;
    (9) rotating next element selection pointer by moving next element selection pointer to: NE pointer (new)=NE pointer (last)+|S| mod N;
    (10) checking if all DAC input codes are applied, and if so, go to step (11), else switch to next DAC input code m and go to step (4); and
    (11) exit.

2. The method of claim 1 wherein said 3-level DAC is a switched capacitor DAC.

3. The method of claim 2 wherein the said switched capacitor DAC has a single-ended implementation.

4. The method of claim 2 wherein the said switched capacitor DAC has a differential-ended implementation.

5. The method of claim 4 wherein said mid-point state element is created by shorting capacitors from both sides of the differential circuit.

6. The method of claim 5 wherein the rotation-based DEM technique spans both sides of a differential circuit as one large capacitor bank.

7. The method of claim 1 wherein N digital input codes are presented as thermometer code.

8. The method of claim 1 wherein, for even N, same adjacent state element pairs are repeatedly set to identical states and combining them into one element.

9. The method of claim 1 wherein any tri-level DEM variant, based on Data Weighted Average DWA technique and intended to suppress tonal DWA behavior is applied to said DEM technique.

10. The method of claim 9 wherein a randomized DWA method is applied to said DEM technique.

11. The method of claim 9 wherein modulator dither is added to said DEM technique.

12. The method of claim 9 wherein extra elements to change tone frequencies are added to said DEM technique.

13. The method of claim 1 wherein said DEM technique is extended using M-level elements by any recursive application of said DEM technique to create new DAC reference levels positioned between existing levels.

14. The method of claim 1 wherein said DEM technique is combined with any other switching arrangement.

15. The method of claim 14 wherein said DEM technique is combined with a constant reference loading technique.

16. A method to reduce reference loading with advantages of reduced power and voltage droop when a tri-level scheme is applied to switched capacitor (S/C) DAC implementations comprising the following steps:
    (1) providing a switched capacitor multi-bit DAC, constructed from three-level state elements, wherein these state elements comprise a positive element, a negative element, and an element corresponding to a mid-point element;
    (2) setting factor N=(number of analog levels of the DAC)−1;
    (3) setting a variable m=DAC digital input code (0<=m<=N);
    (4) checking if m≧N/2 and, if so, connecting 2m-N elements to the positive state reference and 2N-2m to the mid-point state reference and go to step (6), else go to step (5);
    (5) connecting N-2m capacitors to the negative state reference and connecting 2m capacitors to the midpoint state; and
    (6) exit.

17. The method of claim 16 wherein said switched capacitor DAC has a single-ended implementation.

18. The method of claim 16 wherein said switched capacitor DAC has a differential-ended implementation.

19. The method of claim 18 wherein the rotation-based DEM technique spans both sides of the differential circuit as one large capacitor bank.

20. The method of claim 16 wherein said mid-point state element is created by shorting capacitors from both sides of the differential circuit.

21. The method of claim 16 wherein N digital input codes are presented as thermometer code.

22. The method of claim 16 wherein, for even N, same adjacent element pairs are repeatedly set to identical states and combining them into one element.

23. A system for a single-ended 3-level switched capacitor DAC implementation, driven by a rotation-based first-order noise-shaping Dynamic Element Matcher, having any number N+1 analog levels, comprises:
    N capacitors, wherein a first terminal of each capacitor is connected to a correspondent terminal of N arrangements of switches and a second terminal of each capacitor is connected to a first terminal of a sixth switching means and to a first terminal of a seventh switching means:
    said N arrangements of switches, each comprising:
        a first switching means, wherein a first terminal is connected to a positive reference voltage and a second terminal is connected to second terminals of a second and third switching means and to the first terminal of the correspondent capacitor of said N capacitors;
        a second switching means, wherein a first terminal is connected to a mid-point reference voltage and a second terminal is connected to said second terminals of said first and third switching means;
        a third switching means, wherein a first terminal is connected to a negative reference voltage and a second terminal is connected to said second terminals of said first and third switching means; and
        a fifth switching means, being clocked by a second clocking pulse, wherein a first terminal is connected to an output of the DAC and a second terminal is connected to the first terminal of the correspondent capacitor of said N capacitors;
    said sixth switching means, being clocked by a first clocking pulse, wherein a second terminal is connected to a ground reference voltage;

said seventh switching means, being clocked by the second clocking pulse, wherein a second terminal is connected to a first input of an amplifying means and to a first terminal of a feedback capacitor;

said amplifying means wherein a second input is connected to ground reference voltage and its output is the output of the DAC; and said feedback capacitor, wherein a second terminal is connected to the output of said amplifying means.

24. The system of claim 23 wherein all said first, second and third switching means are opened when said first clock pulse is low.

25. The system of claim 23 wherein said sixth switching means is clocked by a clocking pulse that is slightly time advanced relative to said first clocking pulse.

26. The system of claim 23 wherein said seventh switching means is clocked by a clocking pulse that is slightly time advanced relative to said second clocking pulse.

27. The system of claim 23 wherein said switching means are transistors.

28. The system of claim 23 wherein a fourth switching means is deployed in all said N switching arrangements, wherein a first terminal is connected to the second terminals of said first, second and third switching means and a second terminal is connected to said first terminal of said correspondent capacitor of said N capacitors, and wherein it is being clocked by said first clocking pulse.

29. A differential 3-level switched capacitor DAC implementation, driven by a rotation-based first-order noise-shaping Dynamic Element Matcher, having any number N+1 analog levels, comprises:

N capacitors, wherein a first terminal of each capacitor is connected to a correspondent terminal of N switching arrangements and a second terminal of each capacitor is connected to a first terminal of a sixth switching means and to a first terminal of a seventh switching means:

said N switching arrangements, each comprising:
  a first switching means, wherein a first terminal is connected to a positive reference voltage and a second terminal is connected to second terminals of a second and third switching means and to the first terminal of the correspondent capacitor of said N capacitors;
  a second switching means, wherein a first terminal is connected to a mid-point reference voltage and a second terminal is connected to said second terminals of said first and third switching means;
  a third switching means, wherein a first terminal is connected to a negative reference voltage and a second terminal is connected to said second terminals of said first and third switching means; and
  a fifth switching means, being clocked by a second clocking pulse, wherein a first terminal is connected to a first output of the DAC and a second terminal is connected to the first terminal of the correspondent capacitor of said N capacitors;

said sixth switching means, being clocked by the first clocking pulse, wherein a second terminal is connected to a ground reference voltage;

said seventh switching means, being clocked by the second clocking pulse, wherein a second terminal is connected to a first input of a differential amplifying means and to a first terminal of a first feedback capacitor;

said differential amplifying means having said first and a second input and a first and a second output, wherein said outputs are differential outputs of the DAC;

said first feedback capacitor, wherein a second terminal is connected to the first output of said amplifying means;

a second set of N capacitors, wherein a first terminal of each capacitor is connected to a correspondent terminal of a second set of N switching arrangements and a second terminal of each capacitor is connected to a first terminal of an eighth switching means and to a first terminal of a ninth switching means:

said second set of N switching arrangements, each comprising:
  a first switching means, wherein a first terminal is connected to a positive reference voltage and a second terminal is connected to second terminals of a second and third switching means and to the first terminal of the correspondent capacitor of said N capacitors;
  a second switching means, wherein a first terminal is connected to a mid-point reference voltage and a second terminal is connected to said second terminals of said first and third switching means;
  a third switching means, wherein a first terminal is connected to a negative reference voltage and a second terminal is connected to said second terminals of said first and third switching means; and
  a fifth switching means, being clocked by a second clocking pulse, wherein a first terminal is connected to the second output of the DAC and a second terminal is connected to the first terminal of the correspondent capacitor of said N capacitors;

said eighth switching means, being clocked by the first clocking pulse, wherein a second terminal is connected to ground reference voltage;

said ninth switching means, being clocked by the second clocking pulse, wherein a second terminal is connected to the second input of the differential amplifying means and to a first terminal of a second feedback capacitor; and said second feedback capacitor, wherein a second terminal is connected to the second output of said amplifying means.

30. The system of claim 29 wherein all said mid-point reference voltages are interconnected.

31. The system of claim 29 wherein said switching means are transistors.

32. The system of claim 29 wherein all said first, second and third switching means are opened when said first clock pulse is low.

33. The system of claim 29 wherein said sixth and eighth switching means are clocked by a clocking pulse that is slightly time advanced relative to said first clocking pulse.

34. The system of claim 29 wherein said seventh and ninth switching means are clocked by a clocking pulse that is slightly time advanced relative to said second clocking pulse.

35. The system of claim 29 wherein said switching means are transistors.

36. The system of claim 29 wherein a fourth switching means is deployed in both N switching arrangements, wherein a first terminal is connected to the second terminals of said first, second and third switching means and a second terminal is connected to said first terminal of said correspondent capacitor of said N capacitors, and wherein it is being clocked by said first clocking pulse.

* * * * *